US008468757B2

(12) United States Patent
Krause et al.

(10) Patent No.: US 8,468,757 B2
(45) Date of Patent: *Jun. 25, 2013

(54) PHOTOVOLTAIC ROOFING SYSTEMS AND METHODS FOR INSTALLING THEM

(75) Inventors: Richard H. Krause, Collegeville, PA (US); Stephen A. Koch, Collegeville, PA (US); Wayne E. Shaw, Glen Mills, PA (US); Gregory F. Jacobs, Oreland, PA (US); Paul J. Batt, Macungie, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/494,712

(22) Filed: Jun. 12, 2012

(65) Prior Publication Data

US 2012/0317901 A1 Dec. 20, 2012

Related U.S. Application Data

(63) Continuation of application No. 12/266,498, filed on Nov. 6, 2008, now Pat. No. 8,209,920.

(60) Provisional application No. 60/985,942, filed on Nov. 6, 2007.

(51) Int. Cl.
*H01L 31/042* (2006.01)
*H01L 31/05* (2006.01)
*E04D 13/18* (2006.01)

(52) U.S. Cl.
USPC ............................ 52/173.3; 52/748.1; 136/244

(58) Field of Classification Search
USPC ................................. 52/173.3, 748.1; 136/244
See application file for complete search history.

(56) References Cited

U.S. PATENT DOCUMENTS

| 4,040,867 A | 8/1977 | Forestieri et al. |
| 4,189,881 A | 2/1980 | Hawley |

(Continued)

FOREIGN PATENT DOCUMENTS

| DE | 28060810 | 8/1979 |
| DE | 4438858 | 5/1996 |

(Continued)

OTHER PUBLICATIONS

Machine translation of DE10046134, 9 pages, translated Jun. 30, 2011.

(Continued)

*Primary Examiner* — Robert Canfield
(74) *Attorney, Agent, or Firm* — McDonnell Boehnen Hulbert & Berghoff LLP (57) ABSTRACT

The present invention relates to photovoltaic roofing systems in which photovoltaic elements are disposed upon roofing elements such as shingles, tiles, shakes or slates. For example, in one embodiment, the present invention provides a photovoltaic roofing system comprising: a first plurality of horizontally-arranged roofing elements; a bus bar batten system extending across the headlap regions of the first plurality of roofing elements, the bus bar batten system comprising one or more rigid supports and an electrical interconnection system; a first plurality of photovoltaic elements, each disposed on a butt region of one of the first plurality of roofing elements, each operatively engaged with the electrical interconnection system of the bus bar batten system; and a second plurality of horizontally-arranged roofing elements disposed on the roof deck and covering the bus bar batten system and the headlap regions of the first plurality of horizontally-arranged roofing elements.

22 Claims, 5 Drawing Sheets

U.S. PATENT DOCUMENTS

| | | |
|---|---|---|
| 4,321,416 A | 3/1982 | Tennant |
| 4,574,160 A | 3/1986 | Cull et al. |
| 5,180,442 A | 1/1993 | Elias |
| 5,437,735 A | 8/1995 | Younan et al. |
| 5,651,837 A | 7/1997 | Ohtsuka et al. |
| 5,990,414 A | 11/1999 | Posnansky |
| 6,065,255 A | 5/2000 | Stern et al. |
| 6,119,415 A | 9/2000 | Rinklake et al. |
| 6,155,006 A | 12/2000 | Mimura et al. |
| 6,201,180 B1 | 3/2001 | Meyer et al. |
| 6,245,987 B1 | 6/2001 | Shiomi et al. |
| 6,311,436 B1 | 11/2001 | Mimura et al. |
| 6,331,671 B1 | 12/2001 | Makita et al. |
| 6,465,724 B1 | 10/2002 | Garvison et al. |
| 6,521,821 B2 | 2/2003 | Makita et al. |
| 6,553,729 B1 | 4/2003 | Nath et al. |
| 6,649,822 B2 | 11/2003 | Eguchi et al. |
| 6,670,541 B2 | 12/2003 | Nagao et al. |
| 6,840,799 B2 | 1/2005 | Yoshikawa et al. |
| 6,875,914 B2 | 4/2005 | Guha et al. |
| 7,342,171 B2 | 3/2008 | Khouri et al. |
| 2001/0050102 A1 | 12/2001 | Matsumi et al. |
| 2004/0000334 A1 | 1/2004 | Ressler |
| 2005/0257823 A1 | 11/2005 | Zwanenburg |
| 2006/0032527 A1 | 2/2006 | Stevens et al. |
| 2006/0042682 A1 | 3/2006 | Wolfe et al. |
| 2006/0225780 A1 | 10/2006 | Johnson, III et al. |
| 2006/0243318 A1 | 11/2006 | Feldmeier et al. |
| 2007/0074754 A1 | 4/2007 | Farquhar et al. |
| 2007/0157963 A1 | 7/2007 | Metten et al. |
| 2008/0271774 A1 | 11/2008 | Kalkanoglu et al. |
| 2008/0302030 A1 | 12/2008 | Stancel et al. |
| 2009/0000221 A1 | 1/2009 | Jacobs et al. |
| 2009/0014051 A1 | 1/2009 | Gumm |
| 2009/0133738 A1 | 5/2009 | Shiao et al. |
| 2009/0133740 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0205270 A1 | 8/2009 | Shaw et al. |
| 2010/0077680 A1 | 4/2010 | Banister |
| 2010/0126561 A1 | 5/2010 | Reich |
| 2010/0170169 A1 | 7/2010 | Railkar et al. |
| 2010/0275534 A1 | 11/2010 | Ruskin et al. |
| 2010/0313501 A1 | 12/2010 | Gangemi |
| 2011/0017278 A1 | 1/2011 | Kalkanoglu et al. |
| 2011/0132427 A1 | 6/2011 | Kalkanoglu et al. |

FOREIGN PATENT DOCUMENTS

| | | |
|---|---|---|
| DE | 10104297 | 8/2001 |
| DE | 10046134 | 4/2002 |
| DE | 10358851 | 1/2005 |
| EP | 0137666 | 4/1985 |
| EP | 0949686 | 10/1999 |
| GB | 2448920 | 11/2008 |
| JP | 2-280387 | 11/1990 |
| JP | 3-25146 | 2/1991 |
| JP | 5-230960 | 9/1993 |
| JP | 7-202239 | 8/1995 |
| WO | 92/16972 | 10/1992 |
| WO | 93/86605 | 4/1993 |
| WO | 2004/066324 | 8/2004 |
| WO | 2007/035677 | 3/2007 |
| WO | 2007045695 | 4/2007 |

OTHER PUBLICATIONS

International Search Report and Written Opinion for PCT/US2008/082694.

FIG. 1

PRIOR ART

PHOTOVOLTAIC ROOFING SYSTEMS AND METHODS FOR INSTALLING THEM

CROSS-REFERENCE TO RELATED APPLICATIONS

This application is a continuation of U.S. patent application Ser. No. 12/266,498 filed Nov. 6, 2008, now issued as U.S. Pat. No. 8,209,920, which claims priority under 35 U.S.C. §119(e) to U.S. Provisional Patent Applications Ser. No. 60/985,942, filed Nov. 6, 2007, each of which applications is hereby incorporated herein by reference in its entirety.

BACKGROUND OF THE INVENTION

1. Field of the Invention

The present invention relates generally to photovoltaic systems. The present invention relates more particularly to photovoltaic roofing systems in which photovoltaic elements are disposed upon roofing elements such as shingles, tiles, shakes or slates.

2. Summary of the Related Art

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as device performance has improved. They can be used to provide at least a significant fraction of the electrical energy needed for a building's overall function; or they can be used to power one or more particular devices, such as exterior lighting systems.

Existing photovoltaic modules do not blend well aesthetically with conventional roofs, appearing as bulky boxes on top of the roof. Photovoltaic roofing elements are being developed that integrate photovoltaic materials into roofing products, but these have their own attendant problems. For example, asphalt shingles and roofing tiles generally do not allow much room or clearance underneath for electrical connections of photovoltaic elements into an electrical system for take-off of the photovoltaically-generated energy. Moreover, photovoltaic roofing elements can be difficult to install, and once a photovoltaic roofing element is installed in a roof, it can be difficult to replace in case of failure of the photovoltaic element.

SUMMARY OF THE INVENTION

One aspect of the present invention is a photovoltaic roofing system for use on a roof deck, the photovoltaic system comprising:
  a first plurality of horizontally-arranged roofing elements disposed on the roof deck, each having a headlap region and a butt region having a bottom end;
  a bus bar batten system extending across the headlap regions of the first plurality of roofing elements, the bus bar batten system comprising one or more rigid supports and an electrical interconnection system;
  a first plurality of photovoltaic elements, each disposed on a butt region of one of the first plurality of roofing elements, each operatively engaged with the electrical interconnection system of the bus bar batten system; and
  a second plurality of horizontally-arranged roofing elements disposed on the roof deck and covering the bus bar batten system and the headlap regions of the first plurality of horizontally-arranged roofing elements.

Another aspect of the invention is a method of installing a photovoltaic roofing system on a roof deck, the method comprising:
  disposing a first plurality roofing elements on the roof deck in a horizontal arrangement, each having a headlap region and a butt region;
  disposing a bus bar batten system across the headlap regions of the first plurality roofing elements, the bus bar batten system comprising one or more rigid supports and an electrical interconnection system;
  disposing a first plurality of photovoltaic elements on the butt regions of the first plurality of roofing elements and operatively engaging them with the electrical interconnection system of the bus bar batten system; and
  disposing a second plurality of horizontally-arranged roofing elements on the roof deck so as to cover the bus bar batten system and the headlap regions of the first plurality of horizontally-arranged roofing elements.

According to this aspect of the invention, the disposing the first plurality of photovoltaic elements on the butt regions of the first plurality of roofing elements and operatively engaging them with the electrical interconnection system of the bus bar batten system can be performed, for example, before the disposing the second plurality of roofing elements, or after the disposing of the second plurality of roofing elements.

Another aspect of the invention is a method of installing a photovoltaic roofing system on a roof deck, the method comprising:
  disposing a first plurality of photovoltaic roofing elements on the roof deck in a horizontal arrangement, each photovoltaic roofing element comprising a photovoltaic element affixed to a roofing substrate, each roofing substrate having a headlap region and a butt region;
  disposing a bus bar batten system across the headlap regions of the roofing substrates of the first plurality of photovoltaic roofing elements, the bus bar batten system comprising one or more rigid supports and an electrical interconnection system;
  operatively engaging the photovoltaic elements with the electrical interconnection system of the bus bar batten system; and
  disposing a second plurality of horizontally-arranged roofing elements on the roof deck so as to cover the bus bar batten system and the headlap regions of the roofing substrates of the first plurality of horizontally-arranged roofing elements.

Another aspect of the invention is a method of installing photovoltaic elements on a roof, the roof comprising a roof deck, a first plurality of horizontally-arranged roofing elements disposed on the roof deck, and a second plurality of horizontally-arranged roofing elements disposed on the roof deck so as to cover the headlap regions of the first plurality of horizontally-arranged roofing elements, the method comprising disposing a bus bar batten system across the headlap regions of the first plurality of roofing elements and underneath the second plurality of roofing elements, the bus bar batten system comprising a rigid support and an electrical interconnection system;

disposing a first plurality of photovoltaic elements on the butt regions of the first plurality of roofing elements; and engaging each of the first plurality of the photovoltaic elements with the electrical interconnection system of the bus bar batten system.

Another aspect of the invention is a photovoltaic roofing system for use on a roof deck, the photovoltaic roofing system comprising:

a first plurality of horizontally-arranged roofing elements disposed on the roof deck, each having a headlap region and a butt region having a bottom end;

a first bus bar batten system extending across the first plurality of roofing elements, the first bus bar batten system comprising a rigid support and an electrical interconnection system;

a first plurality of photovoltaic elements, each disposed on a butt region of one of the first plurality of roofing elements, each operatively engaged with the electrical interconnection system of the first bus bar batten system;

a second plurality of horizontally-arranged roofing elements disposed on the roof deck and covering the headlap regions of the first plurality of horizontally-arranged roofing elements;

a second bus bar batten system extending across the first plurality of roofing elements, the second bus bar batten system comprising a rigid support and an electrical interconnection system;

a second plurality of photovoltaic elements, each disposed on a butt region of one of the second plurality of roofing elements, each operatively engaged with the electrical interconnection system of the second bus bar batten system and physically engaged with the first bus bar batten system.

Another aspect of the invention is a kit for the installation of a photovoltaic roofing system, the kit comprising one or more bus bar batten systems, each comprising one or more rigid supports and an electrical interconnection system; and a plurality of photovoltaic elements electrically connectable to the electrical interconnection system of the bus bar batten system.

The photovoltaic roofing systems of the present invention can result in a number of advantages over prior art photovoltaic systems. For example, the photovoltaic roofing systems according to certain embodiments of the invention can be conveniently installed on a roof deck. In certain embodiments of the invention, the photovoltaic roofing systems allow photovoltaic elements to be replaced in case of failure or for purposes of an upgrade, long after installation, without having to remove the roofing elements upon which they are disposed. Certain photovoltaic systems according to the present invention can be configured using pre-existing roofing elements (i.e., ones that are already installed on a roof deck).

The accompanying drawings are not necessarily to scale, and sizes of various elements can be distorted for clarity.

DETAILED DESCRIPTION OF THE INVENTION

Figure 1:
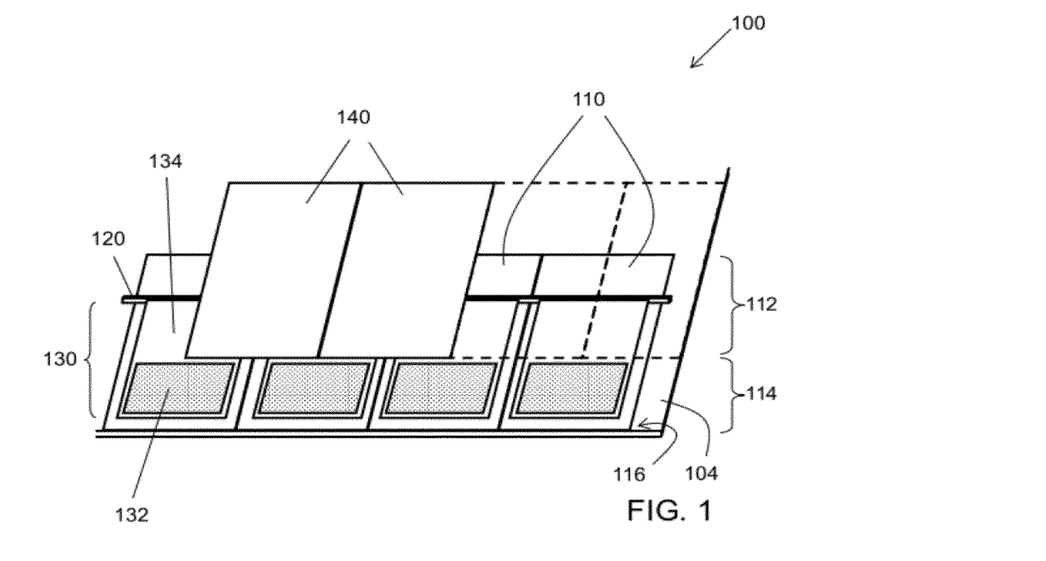
FIG. 1 is a schematic top perspective view of a photovoltaic roofing system according to one embodiment of the invention.

One embodiment of a photovoltaic roofing system according to the present invention is shown in schematic top perspective view in FIG. 1. Photovoltaic roofing system 100 includes a roof deck 104, upon which a first plurality of roofing elements 110 are disposed in a horizontal arrangement. Each roofing element 110 has a headlap region 112 and a butt region 114 having a bottom end 116. A bus bar batten system 120 extends across the headlap regions of the first plurality of roofing elements 110. As described in more detail below, the bus bar batten system comprises a rigid support and an electrical interconnection system. The photovoltaic roofing system further comprises a first plurality of photovoltaic elements 130, each disposed on one of the roofing elements 110, with its photovoltaically-active area 132 over a butt region 114. The photovoltaic elements 130 are operatively engaged with the electrical interconnection system of the bus bar batten system 120. Photovoltaic element 130 includes a photovoltaically inactive area 134 configured to operatively engage with the electrical interconnection system while its photovoltaically-active area 132 is disposed on the butt region of the roofing element. The bus bar batten system acts to interconnect the photovoltaic elements into an electrical system so that the electrical energy that they generate can be used, stored, or sent to the electrical grid. The photovoltaic system 100 further comprises a second plurality of horizontally-arranged roofing elements 140 disposed on the roof deck 104 so as to cover the bus bar batten system 120 and the headlap regions 112 of the first plurality of roofing elements 110. As the person of skill in the art will appreciate, this arrangement of roofing elements, photovoltaic elements and bus bar batten systems can continue up the roof. For example, in the embodiment described above, a second set of photovoltaic elements can be disposed on the second plurality of roofing elements, a second bus bar batten system can be disposed on the headlap region of the second plurality of roofing elements, with the second set of photovoltaic elements operatively connected thereto, a third plurality of horizontally-arranged roofing elements can be disposed on the roof deck and covering the second bus bar batten system and the headlap regions of the second plurality of horizontally-arranged roofing elements, and so on.

Photovoltaic elements suitable for use in the present invention generally comprise one or more interconnected photovoltaic cells. The photovoltaic cells can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide or CIGS. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Thin-film amorphous silicon materials can also be used, which can be provided in flexible forms. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of photovoltaic elements for use in the present invention. In one embodiment of the invention, the photovoltaic element includes a monocrystalline silicon photovoltaic cell or a polycrystalline silicon photovoltaic cell.

The photovoltaic element can optionally comprise various other materials and features, such as a backing substrate (e.g., plastic or metal sheet); a protective covering (e.g., a polymeric film or glass sheet); a granule-coated layer as described in U.S. patent application Ser. No. 11/742,909, which is hereby incorporated herein by reference its entirety; an opaque, semi-opaque, colored or patterned cover element as described in U.S. patent application Ser. No. 12/145,166, which is hereby incorporated herein by reference in its entirety; mounting structures (e.g., clips, holes, or tabs); and one or more optionally connectorized electrical cables for electrically interconnecting the photovoltaic cell(s) of the encapsulated photovoltaic element with an electrical system. The person of skill in the art will recognize that photovoltaic elements for use in the present invention can take many forms, and include many materials and features not specifically mentioned here.

The photovoltaic elements can be encapsulated photovoltaic elements, in which photovoltaic cells are encapsulated between various layers of material. For example, encapsulated photovoltaic element can include a top layer material at its top surface, and a bottom layer material at its bottom surface. The top layer material can, for example, provide environmental protection to the underlying photovoltaic cells, and any other underlying layers. Examples of suitable materials for the top layer material include fluoropolymers, for example ETFE (e.g., NORTON® ETFE films available from Saint-Gobain), PFE, FEP (e.g., NORTON® FEP films available from Saint-Gobain), PCTFE or PVDF. The top layer material can alternatively be, for example, a glass sheet, or a non-fluorinated polymeric material. The bottom layer material can be, for example, a fluoropolymer, for example ETFE, PFE, FEP, PVDF or PVF ("TEDLAR"). The bottom layer material can alternatively be, for example, a polymeric material (e.g., polyester such as PET, or polyolefin such as polyethylene); or a metallic material (e.g., stainless steel or aluminum sheet).

Figure 2:
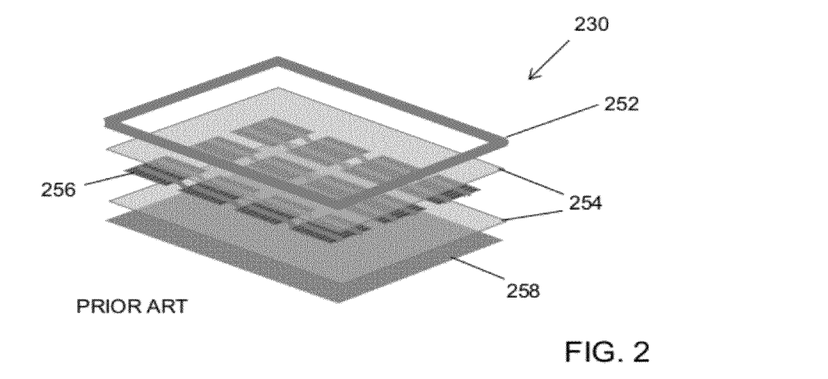
FIG. 2 is a schematic exploded perspective view of an encapsulated photovoltaic element suitable for use in the present invention.

As the person of skill in the art will appreciate, an encapsulated photovoltaic element can include other layers interspersed between the top layer material and the bottom layer material. For example, an encapsulated photovoltaic element can include structural elements (e.g., a reinforcing layer of glass fiber, microspheres, metal or polymer fibers, or a rigid film); adhesive layers (e.g., EVA to adhere other layers together); mounting structures (e.g., clips, holes, or tabs); and one or more optionally connectorized electrical cables for electrically interconnecting the photovoltaic cell(s) of the encapsulated photovoltaic element with an electrical system. An example of an encapsulated photovoltaic element suitable for use in the present invention is shown in schematic exploded view in FIG. 2. Encapsulated photovoltaic element 230 includes a top protective layer 252 (e.g., glass or a fluoropolymer film such as ETFE, PVDF, FEP, PFA or PCTFE); encapsulant layers 254 (e.g., EVA, functionalized EVA, crosslinked EVA, silicone, thermoplastic polyurethane, maleic acid-modified polyolefin, ionomer, or ethylene/(meth) acrylic acid copolymer); a layer of electrically-interconnected photovoltaic cells 256; and a backing layer 258 (e.g., PVDF, PVF, PET).

The photovoltaic element can include at least one antireflection coating, for example as the top layer material in an encapsulated photovoltaic element, or disposed between the top layer material and the photovoltaic cells.

Suitable photovoltaic elements and/or photovoltaic cells can be obtained, for example, from China Electric Equipment Group of Nanjing, China, as well as from several domestic suppliers such as Uni-Solar, Sharp, Shell Solar, BP Solar, USFC, FirstSolar, General Electric, Schott Solar, Evergreen Solar and Global Solar. Thin film-based photovoltaic cells can be especially suitable due to their durability, low heat generation, and off-axis energy collection capability. The person of skill in the art can fabricate encapsulated photovoltaic elements using techniques such as lamination or autoclave processes. Encapsulated photovoltaic elements can be made, for example, using methods disclosed in U.S. Pat. No. 5,273,608, which is hereby incorporated herein by reference. Commercially available photovoltaic devices can be manipulated (e.g., by backing with a substrate) in order to provide the photovoltaic elements used in the present invention.

The top surface of a photovoltaic element is the surface presenting the photovoltaically-active areas of its one or more photoelectric cells. When installed, the photovoltaic elements used in the present invention should be oriented so that their top surfaces are able to be illuminated by solar radiation.

A photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2500 nm. In certain embodiments of the invention, the operating wavelength range of the photovoltaic element falls within the range of about 300 nm to about 1200 nm.

The present invention can be practiced using any of a number of types of roofing elements. For example, the roofing element can be a bituminous roofing element, such as a granule-coated asphalt shingle, for example dimensional or architectural shingles available under the trade names PRESIDENTIAL, GRAND MANOR, INDEPENDENCE available from CertainTeed Corporation. Of course, other asphalt shingle such as conventional three-tab shingles can be used in practicing the present invention. In other embodiments of the invention, the roofing element is a polymeric roofing element, such as a polymeric slate, tile or shake. Polymeric roofing elements suitable for use in the present invention are described, for example, in U.S. patent application Ser. No. 12/146,986, which is hereby incorporated herein by reference in its entirety. As the person of skill in the art will recognize, other types of roofing elements, such as slates, ceramic tiles, wooden shakes, can be used in the present invention.

As used herein, the "butt region" of a roofing element is the area that is exposed when the roofing element is installed on a roof deck and partially overlaid with other roofing elements, as is familiar to the person of skill in the art. The "headlap region" of a roofing element is the area that is covered by other roofing elements when the roofing element is installed on a roof deck.

The bus bar batten systems for use in the present invention can be, for example, long enough to extend across a plurality of roofing elements (e.g., two or more, four or more, or even eight or more). In one embodiment of the invention, the bus bar batten system runs substantially across an entire course of roofing elements. In one embodiment of the invention, the bus bar batten system includes only a single rigid support. In other embodiments of the invention, the bus bar batten system includes a plurality of rigid supports, electrically interconnected, for example, by electrical cables, or interlocking ends. The rigid support(s) of the bus bar batten system can be made out of a variety of materials (e.g., plastic or wood), and can be made by any of a number of techniques (e.g., extrusion, milling, lamination, injection molding). The bus bar batten system can also be provided with markings, for example to facilitate measuring, cutting, nailing, and locations of electrical connections. The rigid supports of the bus bar batten system can be attached to the roof by any of a number of techniques, for example by nailing through a nailing zone of the first plurality of roofing elements.

Figure 3:
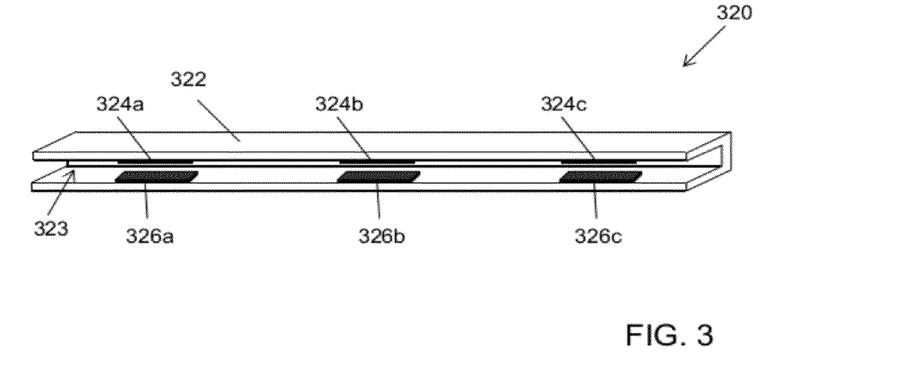
FIG. 3 is a schematic front perspective view of a bus bar batten system suitable for use in the present invention and FIG. 3A is a schematic cross-sectional view of the bus bar batten system including a frangible covering over a channel thereof.

One embodiment of a bus bar batten system is shown in schematic front perspective view in FIG. 3. Bus bar batten system 320 includes a single rigid support 322, and an electrical interconnection system including positive electrodes 324a, 324b and 324c; and negative electrodes 326a, 326b and 326c interconnected by wires (not shown). In this embodiment of the bus bar system, there is a single rigid support 322; in other embodiments of the invention, there can be a plurality of rigid supports (e.g., each wide enough to connect with a single photovoltaic element, or the photovoltaic elements disposed on a single roofing element) with electrical cabling running between them. According to this embodiment of the invention, the rigid support has a linearly-extending channel 323 running along its front face. When installed this channel faces the butt regions of the first plurality of horizontally-arranged roofing elements; it can have, for example, a "U" cross-sectional shape or a "J" cross-sectional shape. In this embodiment of the invention, the electrodes 324 and 326 are disposed on the inner surface of channel 323. The electrodes can be, for example, pads of conductive metal, or flexible U-shaped elements that engage electrode features on the photovoltaic elements. The electrodes can be electrically interconnected in series (e.g., 324a connected to an electrical terminus of the electrical interconnection system; 326a connected to 324b; 326b connected to 324c; 326c connected to another electrical terminus of the electrical interconnection system). The electrodes can alternatively be connected in parallel, or in series-parallel, depending on the desired architecture of the overall electrical system. The bus bar batten system can also include bypass diodes electrically connected between the electrodes of each positive/negative pair (i.e., that are configured to receive the positive/negative termini of a single photovoltaic element, for example, 324a/326a, 324b/326b, 324c/326c); if the electrical resistance of a photovoltaic element increases to an unacceptable level due to failure or shading, the diode can effectively remove it from the circuit. In certain embodiments of the invention, the electrodes 324 and 326 can be built as plugs or sockets, which can engage opposite features on the photovoltaic element to make electrical connection, and optionally a tenacious physical engagement (i.e., a physical connection strong enough to hold the photovoltaic element in place on the roof during ordinary use). In other embodiments of the invention, the opening of the rigid support itself acts as a socket, into which the photovoltaic elements "plug" to make electrical connections and optionally tenacious physical connections.

In certain embodiments of the invention, the photovoltaic elements are tenaciously physically engaged with the one or more rigid supports of the bus bar batten system. For example, the bus bar batten system can include one or more physical features clips, hooks, snaps, sockets, plugs, or other connectors that engage corresponding features on the photovoltaic elements to hold them in place on the roof deck. For example, the physical features can be disposed in the channel to engage with a corresponding physical feature on the back edge of a photovoltaic element. In other embodiments of the invention, the photovoltaic elements can be connected to the one or more rigid supports of the bus bar batten system through fasteners such as nails, screws, tacks or staples, or through adhesive materials such as tape or adhesives.

Figure 4:
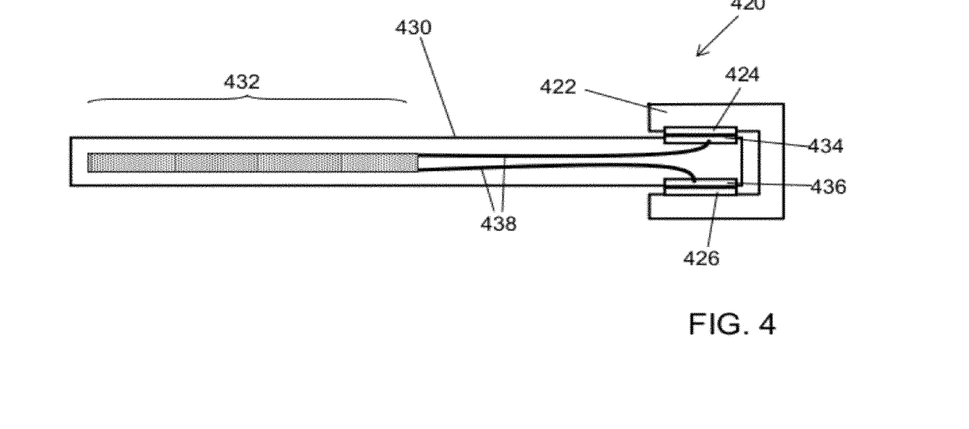
FIG. 4 is a schematic cross-sectional view of an example of a bus bar batten system with a photovoltaic element engaged therewith.

FIG. 4 provides a schematic cross-sectional view of a bus bar batten system with photovoltaic elements engaged therewith. Bus bar batten system 420 is similar to the bus bar batten system shown in FIG. 3, with a generally "U" cross-sectional shape and electrodes disposed on its inner surface. Photovoltaic elements 430 are engaged with the electrical interconnection system (i.e., through electrodes 424 and 426 disposed on the inner surfaces of rigid support 422) of the bus bar batten system. The photovoltaic elements 430 have positive and negative electrodes (434 and 436) on the top and bottom surfaces of its back edge; they operatively engage with the electrodes 424 and 426 of the bus bar batten system. Electrodes 434 and 436 are electrically connected with the photovoltaically-active area 432 of photovoltaic element 430 by wires 438. In certain embodiments of the invention, the electrodes 424 and 426 provide a tenacious physical engagement with the photovoltaic elements 430.

Figure 3A:
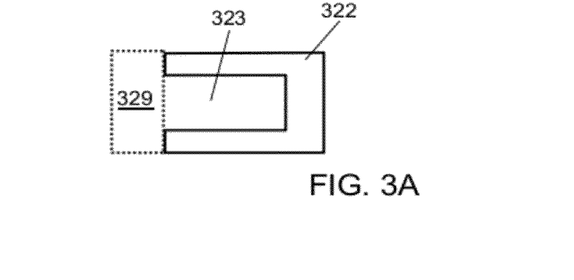

In one embodiment of the invention, a frangible covering is disposed over areas of the channel that do not have a photovoltaic element engaged therein. FIG. 3A schematically depicts an embodiment in which a frangible covering 329 is disposed over a channel 323 of rigid support 322. The frangible covering can be formed, for example, from a thin sheet of hard plastic material. The hard plastic material can be scored or perforated to provide zones of breakage. The frangible covering can cover substantially the entire channel before installation; during installation the act of engaging the photovoltaic elements into channel can break the frangible covering in those areas. In other embodiments of the invention, caps are disposed in the opening of the channel in areas that do not have a photovoltaic element engaged therein. In these embodiments of the invention, the channel can be protected from moisture.

Figure 5:
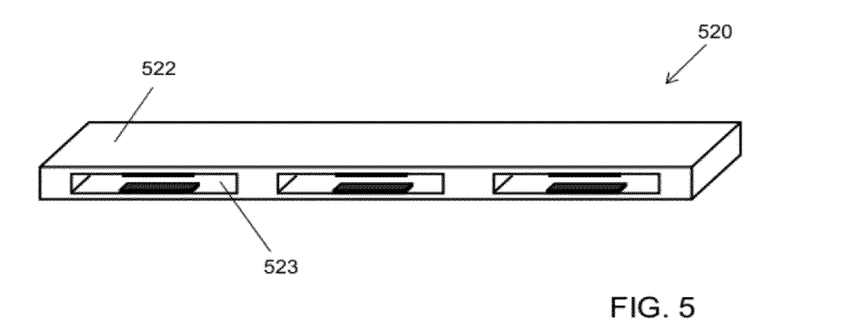
FIG. 5 is a schematic front perspective view of another bus bar batten system suitable for use in the present invention and FIG. 5A is a schematic cross-sectional view of the bus bar batten system including a cap disposed in a recess thereof.
Figure 5A:
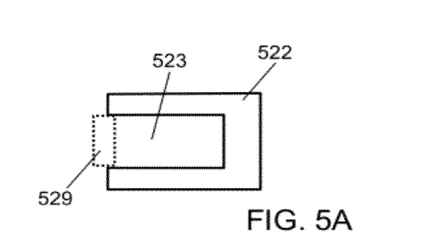

In other embodiments of the invention, the bus bar batten system comprises a plurality of recesses facing the butt regions of the first plurality of horizontally-arranged roofing elements, the recesses having one or more electrodes on an inner surface thereof, the electrodes being operatively connected to the electrical interconnection system. For example, in the embodiment illustrated in perspective view in FIG. 5, bus bar batten system 520 includes a rigid support 522 which has a plurality of recesses 523 formed therein. As described above with respect to FIG. 3, electrodes operatively connected to the electrical interconnection system are disposed on the inner surface of the recesses. As described above with respect to FIG. 4, the photovoltaic element comprises electrodes that are engaged with the electrodes of the bus bar batten system. FIG. 5A schematically depicts an embodiment in which a cap 529 is disposed in a recess 523 of rigid support 522.

In one embodiment of the invention, a frangible covering is disposed in the openings of recesses that do not have a photovoltaic element engaged therein, as described above. In other embodiments of the invention, caps are disposed in the openings of recesses that do not have a photovoltaic element engaged therein. In these embodiments of the invention, the recesses can be protected from moisture.

Figure 6:
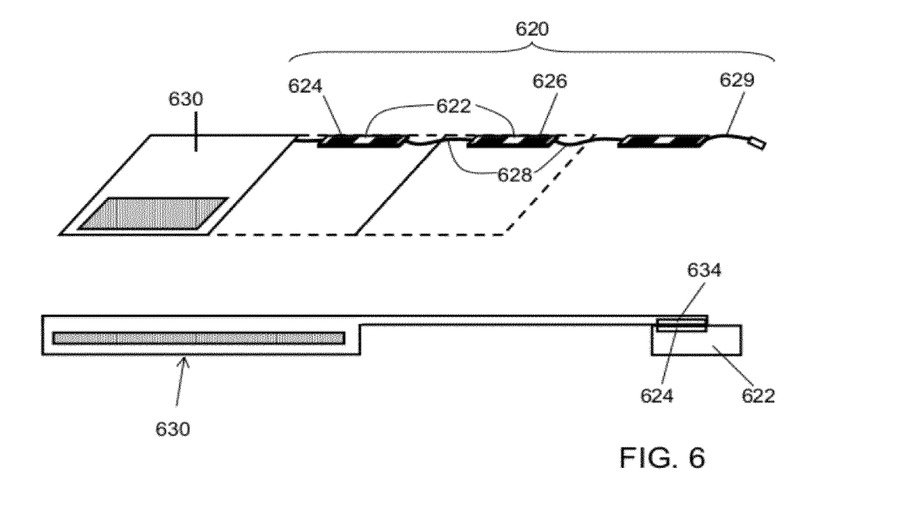
FIG. 6 is a schematic front perspective view and a schematic side cross-sectional view of another example of a bus bar batten system with a photovoltaic element engaged therewith.

In another embodiment of the invention, the one or more rigid supports of the bus bar batten system have electrodes on their top surfaces, and the photovoltaic elements have electrodes on their bottom surfaces. The photovoltaic elements are disposed on the one or more rigid supports such that the electrodes of the bus bar batten system are operatively engaged with the electrodes of the photovoltaic elements. For example, in the embodiment shown in both schematic cross-sectional and schematic front perspective view in FIG. 6, bus bar batten system 620 includes a plurality of rigid supports 622, each of which has positive and negative electrodes 624 and 626 disposed thereon. The rigid supports are connected by cables 628, which interconnect the electrodes of adjacent rigid supports in series. The series of rigid supports can be terminated on either with a connectorized (e.g., quick disconnect) electrical cable 629, for connection into an electrical system. In the embodiment shown in FIG. 6, the photovoltaic elements 630 can be affixed to the rigid supports 622, for example, by nails, which can provide sufficient pressure to maintain the electrical connection between the electrodes of the bus bar batten system and the photovoltaic elements (e.g., 624 and 634 respectively). In other embodiments, the photovoltaic elements plug into sockets on the rigid support(s) of the bus bar batten system.

In another embodiment of the invention, the electrical interconnection system of the bus bar batten system includes quick-disconnect electrical connectors, and wherein the photovoltaic elements comprise quick-disconnect electrical connectors operatively engaged with the quick-disconnect electrical connectors of the bus bar batten system. Quick disconnect connectors are available, for example, from Tyco under the tradename Solarlok®, or from Multi-Connector under the tradename Solar Line. Alternatively, the electrical interconnection system of the bus bar batten system can include slotted connectors, and wherein the photovoltaic elements comprise electrical leads operatively engaged with the slotted connectors of the bus bar batten system. The slotted connectors and electrical leads can be configured to lock together, so that disconnection requires an overt act by a workperson. In these embodiments of the invention, the photovoltaic elements can include appropriately-terminated cables that connect the photovoltaically-active areas into the quick-disconnect electrical connectors or the slotted connectors of the bus bar batten system.

Figure 7:
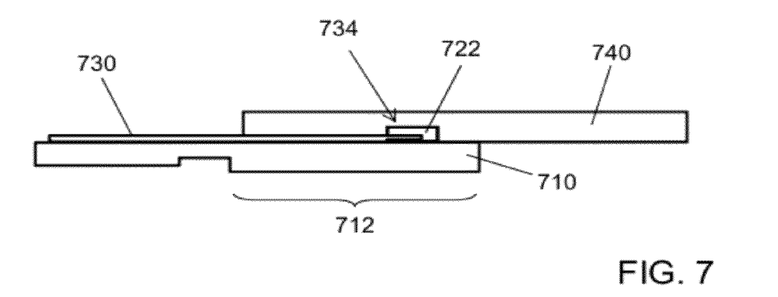
FIG. 7 is a schematic side cross-sectional view of a photovoltaic roofing system including a roofing element having a recess formed in its bottom surface.

As described above, the bus bar batten system is covered by a layer of roofing elements when it is installed. Accordingly, the bus bar batten system and the roofing elements can be configured so that the bus bar batten system fits beneath the roofing elements. For example, bus bar batten system (e.g., the rigid supports in combination with any cables or other elements) can be less than about 2 cm in vertical thickness. In certain embodiments of the invention, the bus bar batten system is less than 1 cm in vertical thickness. In another embodiment of the invention, each of the second plurality of horizontally-arranged roofing elements has a recess formed in its bottom surface, and the bus bar batten system is disposed in the recess. For example, as shown in side cross-sectional view in FIG. 7, rigid support 722 of a bus bar batten system is disposed on first roofing element 710. Photovoltaic element 730 is disposed on first roofing element 710 and plugs into rigid support 722. Second roofing element 740 is disposed so as to cover the headlap end 712 of first roofing element 710 and rigid support 722, and fits into the recess 734 formed in the bottom surface therein.

In certain embodiments of the photovoltaic roofing systems of the present invention, the first plurality of photovoltaic elements are affixed to the first plurality of roofing elements. For example, in one embodiment of the invention, the invention is practiced using photovoltaic roofing elements in which one or more photovoltaic elements are affixed to each roofing element during fabrication of the roofing element, or before installation on the roof deck. As described in more detail below, the invention can also be practiced by first installing the roofing elements on the roof deck, then in a subsequent step affixing the photovoltaic elements on the butt regions of the installed roofing elements. The photovoltaic elements can be affixed to the roofing elements, for example, using a tie layer (see below), by being molded or laminated together with the material of the roofing element during its fabrication. To provide removability of the photovoltaic element (e.g., in case of failure or upgrade), one or more mechanical fasteners or a pressure-sensitive adhesive can be used to affix the photovoltaic elements to the roofing elements.

In certain embodiments of the invention, the photovoltaic element can be affixed to the roofing element through a tie layer, as described in the U.S. patent application Ser. No. 12/266,409, entitled "Photovoltaic Roofing Elements Including Tie Layers Systems, Roofs Using Them, and Methods for Making Them," filed on even date herewith, as well as U.S. Provisional Patent Applications Ser. No. 60/985,932, filed Nov. 6, 2007; Ser. No. 60/985,935, filed Nov. 6, 2007; and Ser. No. 60/986,556, filed Nov. 8, 2007, each of, which is hereby incorporated herein by reference in its entirety. Examples of suitable tie layers, depending on the application, include oxidized asphalt, SBS-modified asphalt, APP-modified asphalt, adhesives, polypropylene/EVA blends, pressure-sensitive adhesives, and maleic anhydride-grafted EVA, polypropylene/polyethylene copolymers, or functionalized EVA. The tie layer can also include a layer of fibrous material partially embedded in the material of the roofing substrate.

The bus bar batten system provides electrical interconnection of the photovoltaic elements into a larger electrical system for the takeoff of electrical power from the roof for direct use, battery storage, or sale to the electrical grid. Individual photovoltaic elements can be connected in series, parallel, or series-parallel. For example, each individual bus bar batten system on a roof can interconnect its photovoltaic elements in series, and the bus bar batten systems can be connected in parallel to create a series-parallel circuit of photovoltaic elements. More details of electrical connections are described in U.S. patent application Ser. No. 11/743,073, which is hereby incorporated herein by reference in its entirety.

Figure 8:
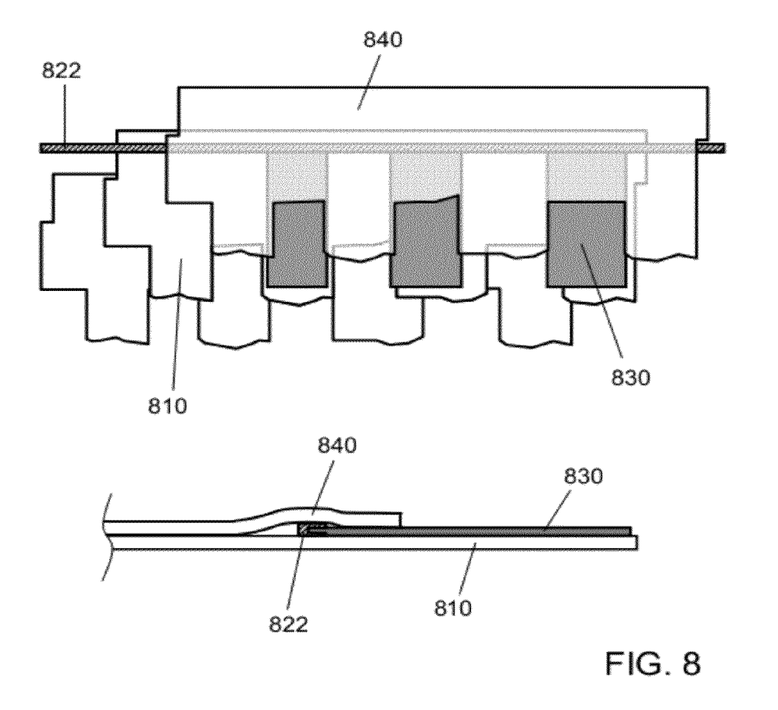
FIG. 8 is a schematic front perspective view and a schematic side cross-sectional view of a photovoltaic roofing system including asphalt shingles according to one embodiment of the invention.

In one embodiment of the invention, the roofing elements are asphalt shingles. For example, one embodiment of the invention is shown in schematic top view and in schematic cross-sectional view in FIG. 8. Bus bar batten system 822 is disposed between asphalt shingles 810 and 840 (e.g., PRESIDENTIAL brand shingles from CertainTeed Corp.). Photovoltaic elements 830 are disposed on the tab regions of shingle 810, and operatively engaged with bus bar batten system 822.

In certain embodiments of the invention the bus bar batten system alters the apparent thickness of the second plurality of horizontally-arranged roofing elements. For example, in the embodiment shown in FIG. 8, the bus bar batten system makes second roofing element (i.e., asphalt shingle 840) appear thicker. In certain embodiments of the invention, the rigid support of the bus bar batten system can have, for example, a rectangular or angled cross-section, in order to provide a desired thickness effect to asphalt shingle 840.

Figure 9:
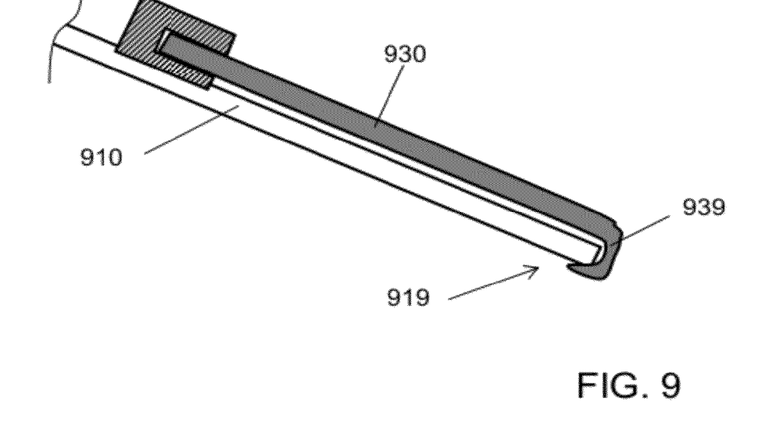
FIG. 9 is a schematic side cross-sectional view of a photovoltaic element engaging the bottom end of a roofing element according to one embodiment of the invention.

In some embodiments of the invention, each photovoltaic element physically engages with the bottom end of the butt region of the roofing element upon which it is disposed. For example, in the embodiment of FIG. 9, photovoltaic element 930 is disposed on roofing element 910. Photovoltaic element 930 has a hooked profile at its bottom end 939, which engages with bottom end 919 of roofing element 910. Hooks or clips can also be used to engage the bottom ends of the first plurality photovoltaic elements.

Another aspect of the invention is a method of installing a photovoltaic roofing system (e.g., as described above) on a roof deck. The method comprises disposing a first plurality of roofing elements on a roof deck in a horizontal arrangement. A bus bar batten system is then disposed across the headlap regions of the first plurality of roofing elements. The bus bar batten system comprises one or more rigid supports and an electrical interconnection system (e.g., including connecting cables). A first plurality of photovoltaic elements are disposed on the butt regions of the first plurality of photovoltaic elements, and operatively engaged with the electrical interconnection system of the bus bar batten system. This embodiment of the invention can be used to install a new roof with photovoltaic power generation capability.

In one embodiment of the invention, the step of disposing a first plurality of photovoltaic elements on the butt regions of the first plurality of roofing elements and operatively engaging them with the electrical interconnection system of the bus bar batten system is performed before the step of disposing the second plurality of horizontally-arranged roofing elements on the roof deck. In this embodiment of the invention, photovoltaic elements are installed course-by-course with the roofing elements. In another embodiment of the invention, the step of disposing a first plurality of photovoltaic elements on the butt regions of the first plurality of roofing elements and operatively engaging them with the electrical interconnection system of the bus bar batten system is performed before the step of disposing the second plurality of horizontally-arranged roofing elements on the roof deck. In this embodiment of the invention, roofing elements and bus bar batten systems can be installed, then the photovoltaic elements can be installed at a later time. The roofing elements can be, for example, flexible (e.g., asphalt shingles or flexible plastic tiles) in this embodiment of the invention.

Another aspect of the invention is a method of installing a photovoltaic roofing system on a roof deck. The method comprises disposing a first plurality of photovoltaic roofing elements on the roof deck in a horizontal arrangement. Each photovoltaic roofing element comprises a photovoltaic element affixed to a roofing substrate. A bus bar batten system is then disposed across the headlap regions of the roofing substrates. The bus bar batten system comprises one or more rigid supports and an electrical interconnection system. The photovoltaic elements of the photovoltaic roofing elements are then operatively engaged with the electrical interconnection system of the bus bar batten system.

Another aspect of the invention is a method of installing photovoltaic roofing elements on a roof. In one embodiment of the invention, a roof comprises a roof deck, a first plurality of horizontally-arranged roofing elements each having a headlap region and a butt region, and a second plurality of horizontally-arranged roofing elements disposed on the roof deck so as to cover the headlap regions of the first plurality of roofing elements 910. In certain embodiments according to this aspect of the invention, the roofing elements 910 are flexible (e.g., asphalt shingles). A bus bar batten system is then disposed across the headlap regions of the first plurality of roofing elements and underneath the second plurality of roofing elements; this operation can be simplified when the roofing elements are flexible. A first plurality of photovoltaic elements are disposed on the butt regions of the first plurality of roofing elements, and operatively engaged with the electrical interconnection system of the bus bar batten system. This embodiment of the invention can be used, for example, in the installation of a new roof with a photovoltaic roofing system (i.e., when the method is performed on the roof shortly after installation of the roofing elements). This embodiment of the invention can also be used to retrofit an existing roof with a photovoltaic roofing system, (e.g., when the method is performed on a roof long after the installation of the roofing elements). The roofing elements can be, for example, flexible (e.g., asphalt shingles or flexible plastic tiles) in this embodiment of the invention. When the roofing elements are asphalt shingles, the retrofitting should be done while the roof is relatively young and the roofing materials still flexible.

Figure 10:
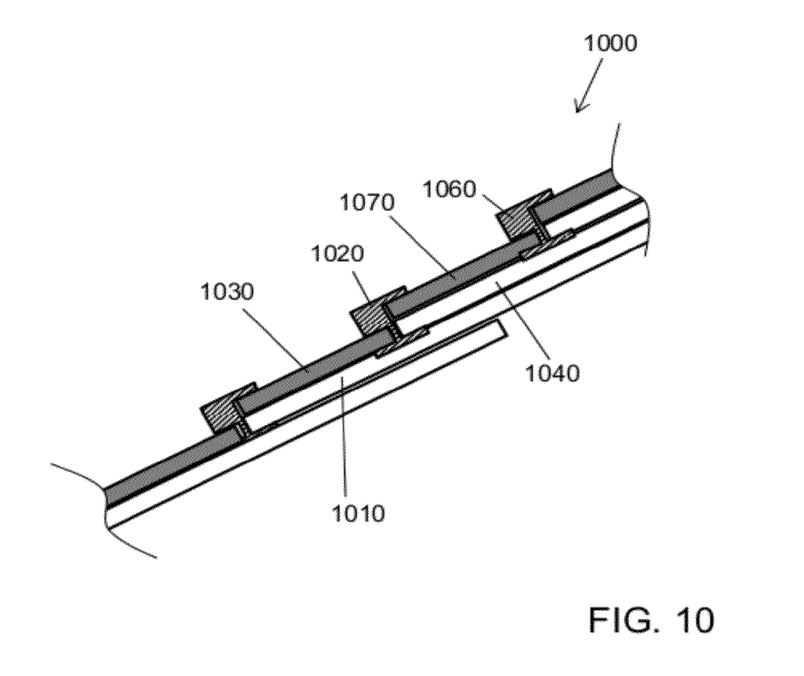
FIG. 10 is a schematic side cross-sectional view of a photovoltaic roofing system according to another aspect of the invention.

Another aspect of the invention is a photovoltaic roofing system for use on a roof deck, an embodiment of which is shown in schematic cross-sectional side view in FIG. 10. Photovoltaic roofing system 1000 includes a first plurality of horizontally-arranged roofing elements 1010 disposed on the roof deck, each having a headlap region and a butt region having a bottom end. A first bus bar batten system 1020 extends across the first plurality of roofing elements 1010, and comprises a rigid support and an electrical interconnection system. Photovoltaic elements 1030 are disposed on the first plurality of roofing elements, each operatively engaged with the electrical interconnection system of the first bus bar batten system 1020. For example, as shown in FIG. 10, the photovoltaic elements 1030 plug into recesses formed in the rigid support of the bus bar batten system 1020, as described above. The photovoltaic roofing system 1000 further includes a second plurality of horizontally-arranged roofing elements 1040 disposed on the roof deck and covering the headlap regions of the first plurality of horizontally-arranged roofing elements 1010. A second bus bar batten system 1060 extends across the second plurality of roofing elements 1040, and second plurality of photovoltaic elements 1070 are disposed on the second plurality of roofing elements 1040. The second plurality of photovoltaic elements are operatively engaged with the electrical interconnection system of the second bus bar batten system 1060, and physically engaged with the first bus bar batten system 1020. That is, the second plurality of photovoltaic elements 1070 can be operatively engaged at their top ends by the second bus bar system, and held in place at their bottom ends by the first bus bar system 1020. Accordingly, each bus bar batten system can include both down-roof facing electrical connections (e.g., as described above), and up-roof facing features to hold the bottom end of a photovoltaic element. For example, as shown in FIG. 10, the rigid supports of the bus bar batten system can include an up-roof facing groove into which the bottom ends of the photovoltaic elements fit. In certain embodiments of the invention, the photovoltaic elements are flexible, so that they can be flexed into position in the up-facing groove. Of course, in certain embodiments of the invention, at least some of the photovoltaic elements are rigid.

Another aspect of the invention is a kit for the installation of a photovoltaic roofing system, the kit comprising one or more bus bar batten systems, each comprising one or more rigid supports and an electrical interconnection system as described above; and a plurality of photovoltaic elements electrically connectable to the electrical interconnection system of the bus bar batten system as described above. The kit can be used, for example, in the installation of a new roof, or to retrofit an existing roof with photovoltaic elements as described above. The kit can also include a set of instructions for the installation of the photovoltaic roofing system as described above. The kit can be packaged together in a single package, or be sold together in a plurality of packages.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A photovoltaic roofing system for use on a roof deck, the photovoltaic roofing system comprising:
    a first plurality of horizontally-arranged roofing elements disposed on the roof deck, each having a headlap region and a butt region having a bottom end;
    a bus bar batten system disposed upon and extending across the headlap regions of the first plurality of roofing elements, the bus bar batten system comprising one or more rigid supports and an electrical interconnection system;
    a plurality of photovoltaic elements, each disposed on one of the first plurality of roofing elements, each operatively engaged with the electrical interconnection system of the bus bar batten system and tenaciously physically engaged with one or more rigid supports of the bus bar batten system, each photovoltaic element physically engaging with the bottom end of the butt region of the roofing element upon which it is disposed; and
    a second plurality of horizontally-arranged roofing elements disposed on the roof deck and covering the bus bar batten system and the headlap regions of the first plurality of horizontally-arranged roofing elements.

2. The photovoltaic roofing system according to claim 1, wherein the bus bar batten system is less than about 2 cm in vertical thickness.

3. The photovoltaic roofing system according to claim 1, wherein the roofing elements are slates, tiles or shakes.

4. The photovoltaic roofing system according to claim 1, wherein the roofing elements are flexible.

5. The photovoltaic roofing system according to claim 1, wherein the bus bar batten system alters the apparent thickness of the second plurality of horizontally-arranged roofing elements.

6. The photovoltaic roofing system according to claim 1, wherein the electrical interconnection system of the bus bar batten system includes quick-disconnect electrical connectors, and wherein the photovoltaic elements comprise quick-disconnect electrical connectors operatively engaged with the quick-disconnect electrical connectors of the bus bar batten system.

7. The photovoltaic roofing system according to claim 1, wherein the rigid supports of the bus bar batten system are made from plastic or wood.

8. A method of installing a photovoltaic roofing system according to claim 1 on a roof deck, the method comprising:
    disposing a first plurality of roofing elements on the roof deck in a horizontal arrangement, each having a headlap region and a butt region;
    disposing a bus bar batten system upon and extending across the headlap regions of the first plurality roofing elements, the bus bar batten system comprising one or more rigid supports and an electrical interconnection system;
    disposing a first plurality of photovoltaic elements on the butt regions of the first plurality of roofing elements and operatively engaging them with the electrical interconnection system of the bus bar batten system, tenaciously physically engaging them with the one or more rigid supports of the bus bar batten system and physically engaging each photovoltaic element with the bottom end of the butt region of the roofing element upon which it is disposed; and
    disposing a second plurality of horizontally-arranged roofing elements on the roof deck so as to cover the bus bar batten system and the headlap regions of the first plurality of horizontally-arranged roofing elements.

9. The method according to claim 8, wherein the step of disposing a first plurality of photovoltaic elements on the butt regions of the first plurality of roofing elements and operatively engaging them with the electrical interconnection system of the bus bar batten system and tenaciously physically engaging them with the one or more rigid supports of the bus bar batten system is performed before the step of disposing the second plurality of horizontally-arranged roofing elements on the roof deck.

10. A method of installing a photovoltaic roofing system according to claim 1 on a roof deck, the method comprising:
    disposing a first plurality of photovoltaic roofing elements on the roof deck in a horizontal arrangement, each photovoltaic roofing element comprising a photovoltaic element affixed to a roofing substrate, each roofing substrate having a headlap region and a butt region;
    disposing a bus bar batten system upon and extending across the headlap regions of the roofing substrates of the first plurality of photovoltaic roofing elements, the bus bar batten system comprising one or more rigid supports and an electrical interconnection system;
    operatively engaging the photovoltaic elements with the electrical interconnection system of the bus bar batten system, tenaciously physically engaging them with the one or more rigid supports of the bus bar batten system, and physically engaging each photovoltaic element with the bottom end of the butt region of the roofing element upon which it is disposed; and
    disposing a second plurality of horizontally-arranged roofing elements on the roof deck so as to cover the bus bar batten system and the headlap regions of the roofing substrates of the first plurality of horizontally-arranged roofing elements.

11. A photovoltaic roofing system for use on a roof deck, the photovoltaic roofing system comprising:
   a first plurality of horizontally-arranged roofing elements disposed on the roof deck, each having a headlap region and a butt region having a bottom end;
   a bus bar batten system disposed upon and extending across the headlap regions of the first plurality of roofing elements, the bus bar batten system comprising one or more rid supports and an electrical interconnection system;
   a plurality of photovoltaic elements, each disposed on one of the first plurality of roofing elements, each operatively engaged with the electrical interconnection system of the bus bar batten system and tenaciously physically engaged with one or more rigid supports of the bus bar batten system; and
   a second plurality of horizontally-arranged roofing elements disposed on the roof deck and covering the bus bar batten system and the headlap regions of the first plurality of horizontally-arranged roofing elements,
   wherein each rigid support comprises a linearly-extending channel facing the butt regions of the first plurality of horizontally-arranged roofing elements the channel having electrodes on its inner surface, the electrodes being operatively connected to the electrical interconnection system, and wherein the photovoltaic elements comprise electrodes that are engaged with the electrodes of the bus bar batten system.

12. The photovoltaic roofing system according to claim 11, wherein a frangible covering is disposed over areas of the channel that do not have a photovoltaic element engaged therein.

13. The photovoltaic roofing system according to claim 11, further comprising one or more caps disposed in the opening of the channel in areas that do not have a photovoltaic element engaged therein.

14. A method of installing a photovoltaic roofing system according to claim 11 on a roof deck, the method comprising:
   disposing a first plurality of roofing elements on the roof deck in a horizontal arrangement, each having a headlap region and a butt region;
   disposing a bus bar batten system upon and extending across the headlap regions of the first plurality roofing elements, the bus bar batten system comprising one or more rigid supports and an electrical interconnection system;
   disposing a first plurality of photovoltaic elements on the butt regions of the first plurality of roofing elements and operatively engaging them with the electrical interconnection system of the bus bar batten system and tenaciously physically engaging them with the one or more rigid supports of the bus bar batten system; and
   disposing a second plurality of horizontally-arranged roofing elements on the roof deck so as to cover the bus bar batten system and the headlap regions of the first plurality of horizontally-arranged roofing elements,
   wherein each rigid support comprises a linearly-extending channel facing the butt regions of the first plurality of horizontally-arranged roofing elements the channel having electrodes on its inner surface, the electrodes being operatively connected to the electrical interconnection system, and wherein the photovoltaic elements comprise electrodes that are engagable with the electrodes of the bus bar batten system,
the method further comprising engaging the electrodes of the photovoltaic elements with the electrodes of the bus bar batten system.

15. The method according to claim 14, wherein the step of disposing a first plurality of photovoltaic elements on the butt regions of the first plurality of roofing elements and operatively engaging them with the electrical interconnection system of the bus bar batten system and tenaciously physically engaging them with the one or more rigid supports of the bus bar batten system is performed before the step of disposing the second plurality of horizontally-arranged roofing elements on the roof deck.

16. A photovoltaic roofing system for use on a roof deck, the photovoltaic roofing system comprising:
   a first plurality of horizontally-arranged roofing elements disposed on the roof deck, each having a headlap region and a butt region having a bottom end;
   a bus bar batten system disposed upon and extending across the headlap regions of the first plurality of roofing elements, the bus bar batten system comprising one or more rid supports and an electrical interconnection system;
   a plurality of photovoltaic elements, each disposed on one of the first plurality of roofing elements, each operatively engaged with the electrical interconnection system of the bus bar batten system and tenaciously physically engaged with one or more rigid supports of the bus bar batten system; and
   a second plurality of horizontally-arranged roofing elements disposed on the roof deck and covering the bus bar batten system and the headlap regions of the first plurality of horizontally-arranged roofing elements,
   wherein each rigid support comprises a plurality of recesses facing the butt regions of the first plurality of horizontally-arranged roofing elements the recesses having one or more electrodes on an inner surface thereof, the electrical contacts being operatively connected to the electrical interconnection system, and wherein the photovoltaic elements comprise electrodes that are engaged with the electrical contacts of the bus bar batten system.

17. The photovoltaic roofing system according to claim 16, wherein the bus bar batten system has a frangible covering disposed over the openings of recesses that do not have a photovoltaic element disposed therein.

18. The photovoltaic roofing system according to claim 16, further comprising one or more caps disposed in the openings of recesses that do not have a photovoltaic elements disposed therein.

19. A method of installing a photovoltaic roofing system according to claim 11 on a roof deck, the method comprising:
   disposing a first plurality of photovoltaic roofing elements on the roof deck in a horizontal arrangement, each photovoltaic roofing element comprising a photovoltaic element affixed to a roofing substrate, each roofing substrate having a headlap region and a butt region;
   disposing a bus bar batten system upon and extending across the headlap regions of the roofing substrates of the first plurality of photovoltaic roofing elements, the bus bar batten system comprising one or more rigid supports and an electrical interconnection system;
   operatively engaging the photovoltaic elements with the electrical interconnection system of the bus bar batten system and tenaciously physically engaging them with the one or more rigid supports of the bus bar batten system; and disposing a second plurality of horizontally-arranged roofing elements on the roof deck so as to cover the bus bar batten system and the headlap regions of the roofing substrates of the first plurality of horizontally-arranged roofing elements, wherein each rigid support comprises a linearly-extending channel facing the butt regions of the first plurality of horizontally-arranged roofing elements the channel having electrodes on its inner surface, the electrodes being operatively connected to the electrical interconnection system, and wherein the photovoltaic elements comprise electrodes that are engagable with the electrodes of the bus bar batten system, the method further comprising engaging the electrodes of the photovoltaic elements with the electrodes of the bus bar batten system.

20. A method of installing a photovoltaic roofing system according to claim 16 on a roof deck, the method comprising:

disposing a first plurality of roofing elements on the roof deck in a horizontal arrangement, each having a headlap region and a butt region;

disposing a bus bar batten system upon and extending across the headlap regions of the first plurality roofing elements, the bus bar batten system comprising one or more rigid supports and an electrical interconnection system;

disposing a first plurality of photovoltaic elements on the butt regions of the first plurality of roofing elements and operatively engaging them with the electrical interconnection system of the bus bar batten system and tenaciously physically engaging them with the one or more rigid supports of the bus bar batten system; and disposing a second plurality of horizontally-arranged roofing elements on the roof deck so as to cover the bus bar batten system and the headlap regions of the first plurality of horizontally-arranged roofing elements, wherein each rigid support comprises a plurality of recesses facing the butt regions of the first plurality of horizontally-arranged roofing elements the recesses having one or more electrodes on an inner surface thereof, the electrical contacts being operatively connected to the electrical interconnection system, and wherein the photovoltaic elements comprise electrodes that are engagable with the electrical contacts of the bus bar batten system, the method further comprising engaging the electrodes of the photovoltaic elements with the electrodes of the bus bar batten system.

21. The method according to claim 20, wherein the step of disposing a first plurality of photovoltaic elements on the butt regions of the first plurality of roofing elements and operatively engaging them with the electrical interconnection system of the bus bar batten system and tenaciously physically engaging them with the one or more rigid supports of the bus bar batten system is performed before the step of disposing the second plurality of horizontally-arranged roofing elements on the roof deck.

22. A method of installing a photovoltaic roofing system according to claim 16 on a roof deck, the method comprising:

disposing a first plurality of photovoltaic roofing elements on the roof deck in a horizontal arrangement, each photovoltaic roofing element comprising a photovoltaic element affixed to a roofing substrate, each roofing substrate having a headlap region and a butt region;

disposing a bus bar batten system upon and extending across the headlap regions of the roofing substrates of the first plurality of photovoltaic roofing elements, the bus bar batten system comprising one or more rigid supports and an electrical interconnection system;

operatively engaging the photovoltaic elements with the electrical interconnection system of the bus bar batten system and tenaciously physically engaging them with the one or more rigid supports of the bus bar batten system; and disposing a second plurality of horizontally-arranged roofing elements on the roof deck so as to cover the bus bar batten system and the headlap regions of the roofing substrates of the first plurality of horizontally-arranged roofing elements, wherein each rigid support comprises a plurality of recesses facing the butt regions of the first plurality of horizontally-arranged roofing elements the recesses having one or more electrodes on an inner surface thereof, the electrical contacts being operatively connected to the electrical interconnection system, and wherein the photovoltaic elements comprise electrodes that are engagable with the electrical contacts of the bus bar batten system, the method further comprising engaging the electrodes of the photovoltaic elements with the electrodes of the bus bar batten system.

\* \* \* \* \*